(12) United States Patent
Johnson

(10) Patent No.: US 7,193,891 B2
(45) Date of Patent: *Mar. 20, 2007

(54) SPIN BASED SENSOR DEVICE

(75) Inventor: Mark B. Johnson, Springfield, VA (US)

(73) Assignee: SpinOp Corporation, Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/369,661

(22) Filed: Mar. 6, 2006

(65) Prior Publication Data

US 2006/0187704 A1    Aug. 24, 2006

Related U.S. Application Data

(60) Continuation of application No. 11/133,518, filed on May 19, 2005, now Pat. No. 7,009,875, which is a continuation of application No. 10/853,545, filed on May 24, 2004, now Pat. No. 6,873,545, which is a continuation of application No. 10/100,210, filed on Mar. 18, 2002, now Pat. No. 6,741,494, which is a continuation of application No. 09/532,706, filed on Mar. 22, 2000, now Pat. No. 6,388,916, which is a division of application No. 08/806,028, filed on Feb. 24, 1997, now Pat. No. 6,064,083, which is a continuation-in-part of application No. 08/643,805, filed on May 6, 1996, now Pat. No. 5,652,445, which is a continuation-in-part of application No. 08/643,804, filed on May 6, 1996, now Pat. No. 5,654,566, which is a continuation-in-part of application No. 08/493,815, filed on Jun. 22, 1995, now Pat. No. 5,565,695, and a continuation-in-part of application No. 08/425,884, filed on Apr. 21, 1995, now Pat. No. 5,629,549.

(51) Int. Cl.
    *G11C 11/00* (2006.01)
(52) U.S. Cl. .................. 365/158; 365/170; 257/295
(58) Field of Classification Search ............... 365/145, 365/158, 171, 172, 173; 257/295, 421, 427
    See application file for complete search history.

(56) References Cited

U.S. PATENT DOCUMENTS

| 4,314,349 A | 2/1982 | Batcher |
| 4,360,899 A | 11/1982 | Dimyan et al. |
| 4,607,271 A | 8/1986 | Popovic et al. |
| 4,663,607 A | 5/1987 | Kitada et al. |

(Continued)

OTHER PUBLICATIONS

Meservey, R. et al., "Magnetic Field Splitting of the Quasiparticle States in Superconducting Aluminum Films," Physical Review Letters, vol. 25, No. 18, pp. 1270-1272, Nov. 2, 1970.

(Continued)

*Primary Examiner*—Gene N. Auduong
(74) *Attorney, Agent, or Firm*—J. Nicholas Gross

(57) ABSTRACT

A spin based electronic device can be used as a magnetic field sensor. The device uses ferromagnetic materials for implementing a variable spin resistance. An external magnetic field can change the magnetization state of the device by orienting the magnetization of the ferromagnetic layers to be parallel or antiparallel, thus changing the resistance of the device to a current of spin polarized electrons.

40 Claims, 9 Drawing Sheets

U.S. PATENT DOCUMENTS

| | | | |
|---|---|---|---|
| 4,700,211 | A | 10/1987 | Popovic et al. |
| 4,780,848 | A | 10/1988 | Daughton et al. |
| 4,896,296 | A | 1/1990 | Turner et al. |
| 4,905,178 | A | 2/1990 | Mor et al. |
| 5,089,991 | A | 2/1992 | Matthews |
| 5,173,873 | A | 12/1992 | Wu et al. |
| 5,206,590 | A | 4/1993 | Dieny et al. |
| 5,237,529 | A | 8/1993 | Spitzer |
| 5,239,504 | A | 8/1993 | Brady et al. |
| 5,245,226 | A | 9/1993 | Hood et al. |
| 5,245,227 | A | 9/1993 | Furtek et al. |
| 5,251,170 | A | 10/1993 | Daughton et al. |
| 5,289,410 | A | 2/1994 | Katti et al. |
| 5,304,975 | A | 4/1994 | Saito et al. |
| 5,329,480 | A | 7/1994 | Wu et al. |
| 5,329,486 | A | 7/1994 | Lage |
| 5,396,455 | A | 3/1995 | Brady et al. |
| 5,408,377 | A | 4/1995 | Gurney et al. |
| 5,416,353 | A | 5/1995 | Kamiguchi et al. |
| 5,420,819 | A | 5/1995 | Pohm |
| 5,424,236 | A | 6/1995 | Daughton et al. |
| 5,432,373 | A | 7/1995 | Johnson |
| 5,448,515 | A | 9/1995 | Fukami et al. |
| 5,452,163 | A | 9/1995 | Coffey et al. |
| 5,465,185 | A | 11/1995 | Heim et al. |
| 5,475,277 | A | 12/1995 | Johnson |
| 5,488,250 | A | 1/1996 | Hennig |
| 5,491,338 | A | 2/1996 | Spitzer |
| 5,493,465 | A | 2/1996 | Kamiguchi et al. |
| 5,580,814 | A | 12/1996 | Larson |
| 5,594,366 | A | 1/1997 | Khong et al. |
| 5,608,593 | A | 3/1997 | Kim et al. |
| 5,621,338 | A | 4/1997 | Liu et al. |
| 5,629,922 | A | 5/1997 | Moodera et al. |
| 5,640,343 | A | 6/1997 | Gallagher et al. |
| 5,652,875 | A | 7/1997 | Taylor |
| 5,998,040 | A | 12/1999 | Nakatani et al. |
| 6,064,083 | A | 5/2000 | Johnson |
| 6,205,008 | B1 | 3/2001 | Gijs et al. |
| 6,342,713 | B1 | 1/2002 | Johnson |
| 6,381,170 | B1 | 4/2002 | Prinz |
| 6,388,916 | B1 | 5/2002 | Johnson |
| 6,975,533 | B2 * | 12/2005 | Johnson ...................... 365/158 |
| 7,009,875 | B2 * | 3/2006 | Johnson ...................... 365/158 |
| 7,020,013 | B2 * | 3/2006 | Johnson ...................... 365/158 |

OTHER PUBLICATIONS

Tedrow, P.M et al, "Spin-Dependent Tunneling into Ferromagnetic Nickel," Physical Review Letters, vol. 26, No. 4, pp. 192-195, Jan. 26, 1971.

Tedrow, P.M. et al., "Spin Polarization of Electrons Tunneling from Films of Fe, Co, Ni, and Gd," Physical Review B, vol. 7, No. 1, pp. 318-326, Jan. 1, 1973.

Horowitz, P. et al., The Art of Electronics, Cambridge Univ. Press, Cambridge U.K. (1980); see p. 328.

Johnson, M. et al., "Interfacial Charge-Spin Coupling; Injection and Detection of Spin Magnetization in Metals," Physical Review Letters, vol. 55, No. 17, pp. 1790-1793, Oct. 21, 1985.

Johnson, M. et al., "Thermodynamic Analysis of Interfacial Transport and of the Thermomagnetoelectric System," Physical Review B, vol. 35, No. 10, pp. 4959-4972, Apr. 1, 1987.

Van Son, P.C. et al., Boundary Resistance of the Ferromagnetic-Nonferromagnetic Metal Interface, Physical Review Letters, vol. 58, No. 21, pp. 2271-2273, May 25, 1987.

Johnson, M. et al., "Ferromagnet-Nonferromagnet Interface Resistance," Physical Review Letters, vol. 60, No. 4, p. 377, Jan. 25, 1988.

Johnson, M. et al., "Coupling of Electronic Charge and Spin at a Ferro-magnetic—Paramagnetic Metal Interface," Physical Review B, vol. 37, No. 10, pp. 5312-5325, Apr. 1, 1988.

Johnson, M. et al., "Spin Injection Experiment," Physical Review B, vol. 37, No. 10, pp. 5326-5335, Apr. 1, 1988.

Johnson, M. et al., "Electron Spin Injection and Detection at a Ferromagnetic-Paramagnetic Interface," J. Appl. Phys. 63 (8), pp. 3934-3939, Apr. 15, 1988.

Van Son, P.C. et al., Physical Review Letters, vol. 60, No. 4, p. 378, Jan. 25, 1988.

Popovic, R.S., Hall-effect Devices, Sensors and Actuators, vol. 17, (1989), pp. 39-53.

Daughton, J., "Magnetoresistive Memory Technology," Thin Solid Films vol. 216, No. 162, Aug. 28, 1992, pp. 162-168.

De Boeck, J. et al., "Non-volatile Memory Characteristics of Submicrometre Hall Structures Fabricated in Epitaxial Ferromagnetic MnAl Films on GaAs," Electronics Letters vol. 29, No. 4, pp. 421-423, Feb. 18, 1993.

Johnson, M., "Spin Accumulation in Gold Films," Physical Review Letters, vol. 70, No. 14, pp. 2142-2145, Apr. 5, 1993.

Johnson, M., "Bipolar Spin Switch," Science, vol. 260, Apr. 16, 1993, pp. 320-323.

Johnson, M., "Bilayer Embodiment of the Bipolar Spin Switch," Appl. Phys. Lett., vol. 63, No. 10, Sep. 6, 1993, pp. 1435-1437.

Johnson, M., "The All-Metal Spin Transistor," I.E.E.E. Spectrum Magazine, May 1994, pp. 47-51.

Johnson, M., "Spin Polarization of Gold Films via Transported," J. Appl. Phys. vol. 75, No. 10, May 15, 1994, pp. 6714-6719.

Johnson, M., "Spin-Coupled Resistance Observed in Ferromagnet-Superconductor—Ferromagnet Trilayers," Appl. Phys. Lett., vol. 65, No. 11, Sep. 12, 1994, pp. 1460-1462.

Johnson, M., "The Bipolar Spin Transistor," I.E.E.E. Potentials, pp. 26-30, Feb./Mar. 1995.

Chui, S.T. et al., "Spin Transmission in Metallic Trilayers," Physical Review Letters, vol. 74, No. 11, Mar. 13, 1995, pp. 2118-2121.

Moodera, J.S. et al., "Large Magnetoresistance at Room Temperature in Ferromagnetic Thin Film Tunnel Junctions," Physical Review Letters, vol. 74, No. 16, Apr. 17, 1995, pp. 3273-3276.

Nakatani, R. et al., "Changes in the Electrical Resistivity of Fe-C/Al2O3/Fe-Ru multilayered films due to a magnetic field," Jour. of Materials Science Letters 10 (1991), pp. 827-828.

* cited by examiner

SPIN BASED SENSOR DEVICE

RELATED APPLICATION DATA

The present invention claims priority to and is a continuation of Ser. No. 11/133,518 entitled Magnetic Memory Device Structure filed May 19, 2005 (now U.S. Pat. No. 7,009,875) which claims priority to and is a continuation of application Ser. No. 10/853,545 filed May 24, 2004 entitled *Hybrid Semiconductor-Magnetic Device and Method of Operation*, (now U.S. Pat. No. 6,873,545) which in turn claims priority to and is a continuation of application Ser. No. 10/100,210 filed Mar. 18, 2002 entitled "*Magnetoelectronic Memory Element With Inductively Coupled Write Wires*," now U.S. Pat. No. 6,741,494 which application Ser. No. 10/100,210 claims priority to and is a continuation of an application Ser. No. 09/532,706 filed Mar. 22, 2000 titled "*Magnetoelectronic Memory Element With Isolation Element*" (now U.S. Pat. No. 6,388,916). The latter application Ser. No. 09/532,706 claims priority to and is in turn a divisional application of Ser. No. 08/806,028 filed Feb. 24, 1997 entitled "*Hybrid Hall Effect Memory Device & Method of Operation*," now U.S. Pat. No. 6,064,083. Ser. No. 08/806,028 claims priority to and is a continuation-in-part of Ser. No. 08/643,805, filed May 6, 1996 titled "*Hybrid Hall Effect Device and Method of Operation*," (now U.S. Pat. No. 5,652,445), which in turn claims priority to and is a continuation-in-part of an application Ser. No. 08/493,815, filed Jun. 22, 1995 titled "*Magnetic Spin Transistor Hybrid Circuit Element*," (now U.S. Pat. No. 5,565,695); and said Ser. No. 08/806,028 claims priority to and is also a continuation-in-part of an application Ser. No. 08/425,884, filed Apr. 21, 1995 titled "*Magnetic Spin Transistor, Logic Gate & Method of Operation*," (now U.S. Pat. No. 5,629,549); and an application Ser. No. 08/643,804 filed May 6, 1996 titled "*Magnetic Spin Injected Field Effect Transistor and Method of Operation*," (now U.S. Pat. No. 5,654,566).

The above applications and materials are expressly incorporated by reference herein.

FIELD OF THE INVENTION

This invention relates generally to hybrid electronic devices comprised of semiconductor structures in combination with ferromagnetic components. In particular, the present invention is directed to a spin polarized electron conduction device formed from ferromagnetic films. The ferromagnetic components contribute new parameters to the devices permitting new applications and improved performance in environments such as non-volatile memory storage.

BACKGROUND OF THE INVENTION

The semiconductor Field Effect Transistor (FET), fabricated typically as a metal oxide semiconductor (MOSFET) structure on a silicon substrate or as a Gallium Arsenide (GaAsFET) device on a Gallium Arsenide substrate, is the building block of modern digital electronics. For example, memory cells for the storage of binary information and logic gates for the processing of digital data streams both use FETs as the primary components.

A review of the cell structures of various prior art memory devices follows. Some of these, such as leading volatile memory technology (i.e. memory which is lost when power is not applied, such as in a dynamic random access memory (DRAM)) use conventional semiconductor FET structures and capacitors in their cell designs. A number of alternative memory technologies that are nonvolatile (i.e. memory is retained when power is not applied) use magnetostatic coupling and magnetoresistors comprised of ferromagnetic elements to effectuate a data storage function. In addition, a recent non-volatile device proposed by the present applicant (see U.S. Pat. No. 5,432,373) using a magnetic spin transistor with one or more passive elements is also reviewed.

Finally, a brief review of the operation of typical logic gates based on conventional FET technology is also provided.

Cell Structures Used In Conventional Volatile Memory Devices

In the case of memory cells used in DRAMs, the most common commercial cell consists of only two elements, a capacitor for data storage and a field effect transistor (FET) for isolation from the array. This cell is popular because the cell size can be made small, resulting in a high packing density and a relatively low production cost. The storage element is a capacitor, and the two stable states representing the binary data "1" or "0" can be, for example, the states with stored charge Q or with stored charge 0. Every cell is connected to an array of write and read wires, also called "bit" and "word" lines. Since one capacitor linked together with other capacitors in an array will lose its charge to its neighbor, the capacitor of each cell is connected to a transistor within that cell so as to be isolated from the array. When the transistor is "on" there is a low resistance to a write or read wire so that an applied voltage can charge the capacitor during a write process or a sense circuit can determine the stored charge during a read process. When the transistor is "off," a high impedance to the write or read wire isolates the capacitor electrically from any other element in the array.

Typically, a Metal Oxide Semiconductor Field Effect Transistor (MOSFET) for use in a DRAM is fabricated by standard lithographic processing techniques on a silicon substrate. The oxide that isolates the gate from the channel is highly insulating, so that the metallized gate has a capacitance to the rest of the device. In some designs the gate capacitance is used as the storage capacitance. Reading is performed with a sense circuit that compares the charge (or voltage) of C with the charge (or voltage) of a standard capacitor C' in a dummy cell. Readout voltages are the order of 10 to 100 mV and the stored charge Q is the order of a million electrons.

The conventional DRAM memory device, however, suffers from a number of operational and physical drawbacks. For one, the memory is volatile. Unavoidable leakage currents discharge the capacitor so that each cell must be refreshed constantly, i.e. read and rewritten, approximately every few milliseconds. Furthermore, background alpha-particle radiation can induce sufficient conductance in the MOSFET to drain the capacitor spuriously, erasing the memory of that cell.

Finally, cell dimensions are not shrinking to the limit permitted by lithography because of restrictions on the capacitor and FET size. Consequently, there are limits on how dense these devices can be made using conventional techniques.

Cell Structures Used In Alternative Non-Volatile Memory Devices

Several alternative technologies can be used to make nonvolatile memory cells. Capacitive memory elements utilizing ferroelectric material as a dielectric have undergone decades of development work, but still suffer from fatigue: they cannot provide an infinite number of read/write cycles.

Several competing approaches use ferromagnetic materials. Three such technologies are reviewed below.

Magnetoresistive Random Access Memory (MRAM)

Magnetoresistive Random Access Memory was proposed a decade ago [J. M. Daughton, "Magnetoresistive Memory Technology," Thin Solid Films 216, 162 (1992)] This device employs an array of bit and word lines. Each bit line is divided into n storage cells. Each cell is a trilayer composed of a ferromagnetic metal base layer, a nonmagnetic metal middle layer, and a ferromagnetic metal top layer. Note that the F-N-F geometry is not the same as giant magnetoresistance (GMR) structures; the layers are so thick that interfacial spin scattering at the F-N interfaces is a negligible fraction of all scattering events, and there is no exchange coupling across the N layer. The cell has length l, width w and thickness d. Looking at a cell in cross section across the width, there are two stable magnetization states determined by magnetostatic coupling, each with the magnetization of the two ferromagnetic films oriented in opposing directions: clockwise and counterclockwise.

The resistance of each cell, measured with a sense current applied along the length of the cell, is a function of the anisotropic magnetoresistance (AMR) of the F layers. It has value $R_1$ when the magnetizations are perpendicular to the sense current (as is the case for either stable magnetization state) and $R_1'$ if the magnetizations of the ferromagnetic layers are forced to lie parallel to the sense current. Each cell in the bit line is connected to the next cell with a conducting strip which has resistance $R_c$.

Columns of n word lines cross the m rows of bit lines. Each nonmagnetic word line crosses the top of a cell in each bit line. The state of cell (ij) is written by sending current pulses of appropriate amplitude through bit line i and word line j, using the magnetic fields from the currents to cause the magnetization of the cell to orient either clockwise or counterclockwise. The contents of the cell are read by first biasing word line j with a large enough current so that fields from the current cause the magnetizations of both ferromagnetic layers to be canted to an orientation that is approximately 45 degrees away from the axis of the bit line.

In this orientation the resistance of the cell (for a sense current applied along the bit line) has a value $R_2$ that is between $R_1$ and $R_1'$. Next, a sense current is applied along the bit line, and a voltage is measured across the bit line, having a value proportional to $(n-1)R_1+R_2+nR_c$. Finally, a read current pulse is applied to the word line, in addition to the original bias current. The field from this current pulse changes the magnetization orientation in a direction more nearly parallel to the sense current if the initial orientation was clockwise, or in a direction more nearly perpendicular to the sense current if the initial orientation was counterclockwise. Thus, the voltage across the bit line either increases or decreases when the read pulse is applied. A sense circuit that measures changes of voltage records the positive or negative change as a "1" or a "0."

By using a derivative sense technique, MRAM avoids the necessity of electrically isolating each cell. However, this approach for a non-volatile memory element also suffers from a number of drawbacks.

To begin with, the readout voltage is quite small and the signal to noise ratio is poor. The change in resistance that must be sensed during the read process is a small fraction of $R_1$, and this small change must be distinguished from a background of approximately $nR_1+R_c$. In practice, two elements are fabricated for each cell, thus doubling the signal, and the read process is repeated several times so that the final readout is taken as an average of repeated samplings, thus lowering the noise. This increases the time for a read cycle. Power dissipation is relatively large during readout because relatively large currents must be applied to long, resistive lines. Finally, errors can be introduced during readout if the bias current tips the magnetization into an unstable state.

MRAM with GMR Elements

Another conventional approach uses a magnetoresistor R as the storage element, and the cell is comprised of R, a reference resistor R', and two or three FETs to isolate the cell from the rest of the array. The magnetoresistor R is typically a thin film ferromagnetic metal (or ferromagnetic/nonmagnetic metal multilayer) resistor with length l, width w and thickness d, and has two values, R' and R'+δR, corresponding to two stable magnetization states.

For example, in one state the magnetization of a permalloy film might be parallel to the direction of flow of the sense current, $I_{sense}$, and in the other state the magnetization might be perpendicular to $I_{sense}$. For GMR elements, one state corresponds to the magnetizations ^M1 and ^M2 of F1 and F2 aligned parallel (or the magnetizations $M_i$ of all ferromagnetic layers in a multilayer stack aligned parallel), and in the other state ^M1 and ^M2 are antiparallel (or the alternate ferromagnetic layers of the multilayer stack are antiparallel). The magnetization state is written by using the magnetic field generated by current pulses applied to an array of write lines.

The read process begins by selecting a cell. When a cell is addressed the isolating FETs are set to the "on" state by driving the appropriate word line to a high voltage. In this state the FETs conduct current with some low resistance, the order of 1000 Ω or less. A bias current $I_{sense}$ is then applied to both the magnetoresistor R and the reference resistor R'. A sense circuit at the end of a line of cells compares the two voltages and interprets a "1" or "0" when, for example, $I_{sense}*(R-R')>0$ or $I_{sense}*(R-R')=0$ respectively. The voltage levels corresponding to "1" (or "0") are then amplified to TTL or CMOS levels.

The voltage $I_{sense}*\delta R$ that distinguishes a "1" from a "0" must be large enough for reliable discrimination. Since the magnetoresistive ratio δR/R' of ferromagnetic films (or GMR multilayers) is small, 10 percent or less, the magnetoresistor must be made quite large. For example, with R=100 Ω and δR/R'=0.06, a reasonable bias current of 1 mA would produce a readout voltage difference of only 6 mV, and a poor signal to noise ratio is a characteristic of GMR cells.

This approach has several other drawbacks. A resistor occupies substantial area in a cell. Continuing the above example, the 100 Ω magnetoresistor could be fabricated using ferromagnetic materials with resistivities of about 20 μΩ-cm, with a length l=5 μm, width w=1 μm, and thickness d=0.01 μm. In addition, this cell requires the fabrication of two resistors, R and R', thus requiring additional isolation FETs and, all together, taking up considerable space. The reference resistor cannot be placed outside the cell because the resistive difference, δR, is so small that the resistance of each memory resistor must be matched to a particular reference. Since resistance is a function of temperature, R=R(T), the reference resistor must be fabricated very near the magnetoresistor so that both resistors will always be at the same temperature, and the material for the reference resistor must be carefully chosen so that the temperature dependence of its resistivity is similar to that of the magnetoresistor. Finally, the resistance of each cell is quite large. When numerous cells are placed on a single read line, as in an array, the resistance of the read line is substantial. Since the read process uses current bias, the power dissipated in each read cycle is relatively large.

Spin Transistor Nonvolatile RAM (NRAM)

Active devices using magnetic spin transport are well known in the art. The history of spin transport begins with an experiment by Meservey [R. Meservey, P. M. Tedrow and P. Fulde, Phys. Rev. Lett. 25, 1270 (1970); P. M. Tedrow and R. Meservey, Phys. Rev. Lett. 26, 192 (1971); Phys. Rev. B 7, 318 (1973)] where it was shown that the electric current tunneling from a ferromagnetic electrode across a low transmission barrier into a superconducting detector carried a net spin polarization. A later spin injection experiment [described in several journals, including Mark Johnson and R. H. Silsbee, Phys. Rev. Lett. 55, 1790 (1985); Phys. Rev. B 35, 4959 (1987); Phys. Rev. B 37, 5312 (1988); Phys. Rev. B 35, 5326 (1988)] then demonstrated that (i) current driven across any ferromagnet-nonferromagnet (F1-N) interface carried a net spin polarization, (ii) that a nonequilibrium population of spin polarized electrons, equivalently a nonequilibrium magnetization ~M, diffused away from the F1-N interface into N with a characteristic length equal to the classic spin diffusion length $\delta_s$, and (iii) that the nonequilibrium magnetization in N affected the current flow (or the voltage developed) at the N-F2 interface of a second ferromagnetic film.

The idea of incorporating the spin injection effects to semiconductors was mentioned in the art even before the spin injection experiment by the present applicant proved the validity of the phenomenon. Indeed, Aronov [A. G. Aronov, Sov. Phys. JETP 24, L32 (1976)] proposed that a current driven from a ferromagnet into a semiconductor would be spin polarized, and that the spin polarization of the current in the semiconductor (N) would be maintained over a length scale of a diffusion length. However, to date applicant is unaware of any known successful implementations of these proposals.

Datta and Das, citing the spin injection experiment performed by the applicant, and noting the long spin diffusion lengths measured in aluminum ($\delta_s$ approximately 0.5 mm at low temperature), proposed [S. Datta and B. Das, Appl. Phys. Lett. 56, 665 (1990)] a device illustrated in FIG. 2 wherein spin injection is extended to a FET-like structure: iron contacts are employed as the source and drain and the gate voltage was to be used to modulate the source-drain current allowing the device to perform as a current modulator. According to their proposed device a nonmagnetic metal gate 174 is fabricated on a Schottky (or an insulating) barrier 176 on top of a layer of InAlAs 178 that is grown on an InGaAs substrate 180. The InAlAs—InGaAs interface forms a high conductance Two Dimensional Electron Gas (2DEG) 182 region that acts as the conducting channel between source and drain, which are thin iron films 170 fabricated on either side of the gate 174 and in contact with the 2DEG 182. The magnetizations, $\hat{M}_s$ 184 and $\hat{M}_d$ 186, of the source and drain ferromagnetic films are always aligned in parallel and along the $\hat{x}$ direction. The source provides spin polarized electrons to the channel with the spin axes of the electrons oriented parallel to the magnetization of the source and drain, along $\hat{x}$. Because of the spin injection effect the source-drain conductance is proportional to the projection of the spin orientation of the polarized electrons reaching the drain on the orientation of the drain magnetization. A voltage $V_g$ 172 applied to the gate 174 generates an electric field along $\hat{z}$ along with an associated effective magnetic field along $\hat{y}$, and causes the spin axis of each electron to precess [refer to a description of the Rashba effect in the above article by Datta and Das]. Thus, the orientation of the spin axes of the current carrying electrons relative to the magnetization 186 of the drain is a function of gate voltage 172: the source-drain conductance (and current) is modulated periodically as the gate voltage is monotonically increased, and the device proposed by Datta and Das functions as a current modulator.

The Datta and Das device, however, has not yet been sucessessfully fabricated and demonstrated, and the concept has never been adapted to be used as a conventional FET because a Schottky barrier at the semiconductor-iron interface damages device performance by introducing large resistances at the source and drain. It is also likely (though unproven) that the Schottky barrier acts to impede the flow of spin polarized electrons by randomizing the spin orientation of each electron. Neither has the Datta and Das device concept been adapted to be used as a memory element because the magnetizations $\hat{M}_s$ and $\hat{M}_d$ were locked in a parallel configuration. Furthermore, the polarized spins were injected with orientation along $\hat{x}$ so that they would precess under the influence of the effective magnetic field (associated with the gate voltage) along $\hat{y}$, and the length of the 2DEG conducting channel was designed to be sufficiently long that the spin polarized electrons could accumulate large phase angles as a result of their precession. In practice, precession under the influence of a field along $\hat{y}$ leads to randomization of spin orientation and acts to destroy the knowledge of the initial state of the spin polarized electron; therefore the information of the memory state (of the source or drain) is lost.

A replacement for conventional semiconductor devices was proposed by the present applicant in connection with a device known as the bipolar spin transistor. This device and related modifications is described in Mark Johnson, "The All Metal Spin Transistor," I.E.E.E. Spectrum Magazine, Vol. 31 No. 5 p. 47 (1994); and Mark Johnson, "The Bipolar Spin Transistor," Science 260, 320 (1993). This device is depicted in FIG. 1, with F1 150 and F2 152 arranged on one side of a bulk sample of aluminum 154. F1 150 injects a source of diffusing spin polarized electrons 156 and F2 152 detects their presence. This device is a novel F-N-F structure that can be used as a circuit element in a nonvolatile memory cell and has several advantages. Since the readout voltage is bipolar, positive for $\hat{M}1$ and $\hat{M}2$ parallel and negative for $\hat{M}1$ and $\hat{M}2$ antiparallel, the discrimination between a logical "1" and "0" is relatively easy; each cell needs only a single storage element whose readout is compared with ground. Furthermore, the transimpedance of the spin transistor scales inversely with size, so the readout voltage is larger (for constant current) for smaller devices, thus promoting the shrinking of cell size.

Two characteristics of the device must be taken into consideration when using the device in NRAM. First, the device can be fabricated entirely from metals, and is therefore characterized by a low electrical impedance. Thus, to fabricate an array of such elements it is necessary to electrically isolate each element from others in the array, so that the output of any element will not be shorted to ground through a neighboring element. Second, the output voltages available from the device are less than TTL or CMOS levels, and the output must therefore be amplified before it is incorporated in TTL or CMOS circuits.

Another spin transistor NRAM cell design [Mark Johnson, "Magnetic Spin Transistor," U.S. Pat. No. 5,432,373, issued Jul. 11, 1995] is composed of a spin transistor and one or more capacitors and resistors. The passive elements provide isolation for the spin transistor of each cell, and the readout voltage was transmitted to the end of a line of elements for amplification. A drawback of this design is that resistors and capacitors take up substantial space on a chip. Thus, a substantial portion (even a majority) of cell area is occupied by passive elements, packing densities are limited, and the unique scaling feature of the spin transistor is wasted.

Furthermore, cell isolation is not very efficient and the readout voltage can be degraded during transmission to the sense circuit, resulting in higher noise and lower readout sensitivity. More recent proposals for spin transistor memory cell designs [see applications referenced above] incorporate a spin transistor with one (or more) isolating FETs. This is a practical approach, and can achieve packing densities comparable with, or higher than, DRAM.

However, until the present invention it has been impossible to integrate the functions of nonvolatile storage and cell isolation in a single element.

FET Logic Gates

Logic operations in computing devices are typically performed with digital voltage pulses and FET gates that are linked together in an appropriate way. To provide an example that permits a brief critical discussion, a standard arrangement [Paul Horowitz and Winfield Hill, "The Art of Electronics," Cambridge Univ. Press, Cambridge U.K. (1980); see p. 328] for an AND gate operation is depicted in FIG. 3 where each element $Q_i$ is an enhancement mode FET. $Q_1$ 10, $Q_2$ 12 and $Q_5$ 18 are p-channel FETs. A p-channel FET has a high impedance, and is therefore in the "off" state, when the gate voltage is zero or positive. It has a low impedance, and is therefore in the "on" state, when the gate voltage is lower than a threshold value below zero (where the threshold value is typically 0.5 Volt or less). $Q_3$ 14, $Q_4$ 16 and $Q_6$ 20 are n-channel FETs. An n-channel FET is "off" when the gate voltage is below ground and "on" when the gate voltage is larger than a threshold value above ground. Voltage pulses of positive or zero amplitude (HIGH or "1"; or LOW or "0") are applied simultaneously to the inputs A 22 and B 24, and the cell operates as an AND gate in the following way.

When inputs A 22 and B 24 are HIGH ("1"+"1"), $Q_3$ 14 and $Q_4$ 16 are "on", $Q_1$ 10 and $Q_2$ 12 are "off", and consequently the voltage at node 26 is at LOW, i.e. at ground. Since $Q_6$ 20 is "off" and $Q_5$ 18 is "on" the voltage output (OUT) 28 is HIGH ("1"). When A 22 and B 24 are LOW ("0"+"0"), $Q_3$ 14 and $Q_4$ 16 are "off", $Q_1$ 10 and $Q_2$ 12 are "on", and consequent voltage at node 26 is HIGH. Since $Q_5$ 18 is "off" and $Q_6$ 20 is "on" the voltage output (OUT) 28 is LOW, at ground ("0"). When A 22 (or B 24) is HIGH and B 24 (or A 22) is LOW ("1"+"0"), $Q_3$ 14 and $Q_2$ 12 are "on", $Q_1$ 10 and $Q_4$ 16 are "off", and consequently the voltage at node 26 is HIGH and the voltage output (OUT) 28 is LOW, at ground ("0"). The truth table 30 for the above operations is seen to be the same as that of an AND gate.

Although logic gates of this design are the backbone of digital electronic processing, they suffer from several disadvantages. It requires numerous FETs (six in the example of FIG. 1) to comprise the logic gate cell, and therefore the cell occupies a large area of the chip. Furthermore, the result of the Boolean process is not stored and must be synchronized with a clock cycle to be used in the next operating step, or must be sent to a separate storage cell for later recall. The above discussion was presented for complimentary metal oxide silicon (CMOS) logic devices. The transistor-transistor logic (TTL) family is based on bipolar transistors, but similar conclusions apply. In other words, the cell of a single TTL logic gate is comprised of several transistors and several resistors, and uses considerable space on a chip. It is apparent that it would be desirable to integrate the functions of logic operation and storage in a single element.

SUMMARY OF THE INVENTION

Accordingly, there is a significant need for improved FETs and similarly operating logic devices that can be used easily and reliably in high density memory and logic environments.

An object of the present invention therefore is to provide a novel hybrid FET structure that can be used as a memory element for the nonvolatile storage of digital information, as well as in other environments (including, for example, logic applications for performing digital combinational tasks, or a magnetic field sensor).

According to a first embodiment of the present invention, a novel FET is describing using ferromagnetic materials for the source and drain, and can be described as a "spin injected FET." This spin injected FET has two operating stable states determined by the gate voltage, "off" and "on". The first (e.g. source) and second (e.g. drain) ferromagnetic layers of this new FET are both fabricated to be magnetically anisotropic so as to permit the device to have two stable magnetization states, parallel and antiparallel. In the "on" state the spin injected FET has two settable resistance states determined by the relative orientation of the magnetizations of the ferromagnetic source and drain, "HIGH" (antiparallel) and "LOW" (parallel). One of the ferromagnetic films (source) can be fixed with a large magnetic coercivity and polled in one direction and the other ferromagnetic film (drain) has a smaller coercivity. An external magnetic field can change the magnetization state of the device by orienting the magnetization of the drain to be parallel or antiparallel relative to that of the source.

In a magnetic sensor embodiment of the present invention, the spin injected FET can be incorporated in a "read" head for reading digital magnetic recorded data.

In a memory storage element embodiment, the spin injected FET can be provided having a conductive write layer for carrying a write electric current and inductively coupling a write magnetic field associated with this write current to the second (drain) ferromagnetic film. An external current generator can change the magnetization state of the drain, therefore, by inductively coupling a magnetic field to the drain. Even if power is removed from the above device, the second ferromagnetic film orientation is retained in its set state, thus causing the spin injected FET to behave as a non-volatile memory element because the two states of the magnetization orientation of said second ferromagnetic layer can correspond to data values stored in said memory element. An array of spin injected FETs can be coupled together in an array to form a spin injected FET memory array.

The present spin injected FET therefore will find application as the basic storage element in integrated arrays of nonvolatile random access memories (NRAM), and may replace DRAM and direct access memory (such as magnetic disk drives) in many applications. The present spin injected FET invention is a substantial improvement over prior memory cell elements. Compared with DRAM, the spin injected FET has only a single element in the cell permitting the memory cell to be made smaller, the memory is nonvolatile and is not susceptible to errors induced by background radiation (i.e. it is radiation hard). Compared to other nonvolatile memory cells, the spin injected FET has only a single element, permitting the cell size to be smaller, the cell is automatically isolated from the array unless it is addressed, and the memory array is compatible with existing CMOS (or other semiconductor) technology.

Further according to another embodiment of the present invention, a logic gate can be fabricated using the spin injected FET. This logic gate can implement any desired combinational task (function) relating one or more inputs to the spin injected FET to an output thereof. Depending on the particular function to be implemented, the state of the logic gate (which is determined by the magnetization state of the drain) is first set using a magnetic field generated by a current pulse transmitted in a write line inductively coupled to the ferromagnetic drain. This same wire also inductively couples a magnetic field generated by the combined current of one or more input data signals to the spin injected FET. The ferromagnetic drain magnetization can be configured to change or retain its orientation, depending on a particular combination of input data signals corresponding to the boolean operation desired. In other words, the ferromagnetic drain magnetization may be read out as an output binary "1" or "0" corresponding to some Boolean process dependent on the data input signals.

In any specific logic function embodiment, therefore, the present invention can be configured to implement the function of any of the following gates: a NOR gate, a NOT gate, a NAND gate, an OR gate and an AND gate, or more generally any logic gate implementing a combinational task relating one or more combination of inputs/outputs. The present spin injected FET invention is a substantial improvement over prior logic gates using semiconductor transistors [ordinary FETs for CMOS or bipolar transistors for TTL]. The spin injected FET requires fewer elements per logic cell, so cell size can be reduced and packing density increased. The result of each processing step is stored as the nonvolatile state of the device and can be read out at any later time, without synchronization to a clock cycle. In this way, parallel processing by several logic gates is facilitated. Furthermore, although the basic ideas are presented herein for a two-state device, appropriate for binary processing, it is possible to fabricate a ferromagnetic layer with more than two stable magnetization states. Therefore, more generally an n-state device can be fabricated, and simultaneous processing of n bits by each logic gate is possible.

Furthermore, in contrast to the prior art Datta and Das spin transport device described above, the spin injected FET of the present invention employs one ferromagnetic layer (source) with fixed magnetization orientation and a second ferromagnetic layer (drain) with a magnetization whose orientation changes between two stable configurations: parallel or antiparallel with the magnetization orientation of the source. The invention then uses the memory effect associated with the hysteresis of the ferromagnetic layer at the drain in order to create a spin injected FET memory element or logic gate.

DETAILED DESCRIPTION OF THE INVENTION

The present invention makes use of spin polarized electron (or hole) transport at ferromagnetic-non ferromagnetic interfaces, a phenomenon which is well known in the art. Further details on this topic can be found in the above mentioned articles and journals, as well as in Johnson, Phys. Rev. Lett. 70, 2142 (1993), all of which are incorporated by reference herein. Moreover, further details on the structure and operation of the general bipolar magnetic spin transistor shown in FIG. 4 can be found in the above reference pending applications Ser. Nos. 08/425884 and 08/493815, which are also incorporated by reference herein.

Spin Injected FET Memory Element

Figure 1:
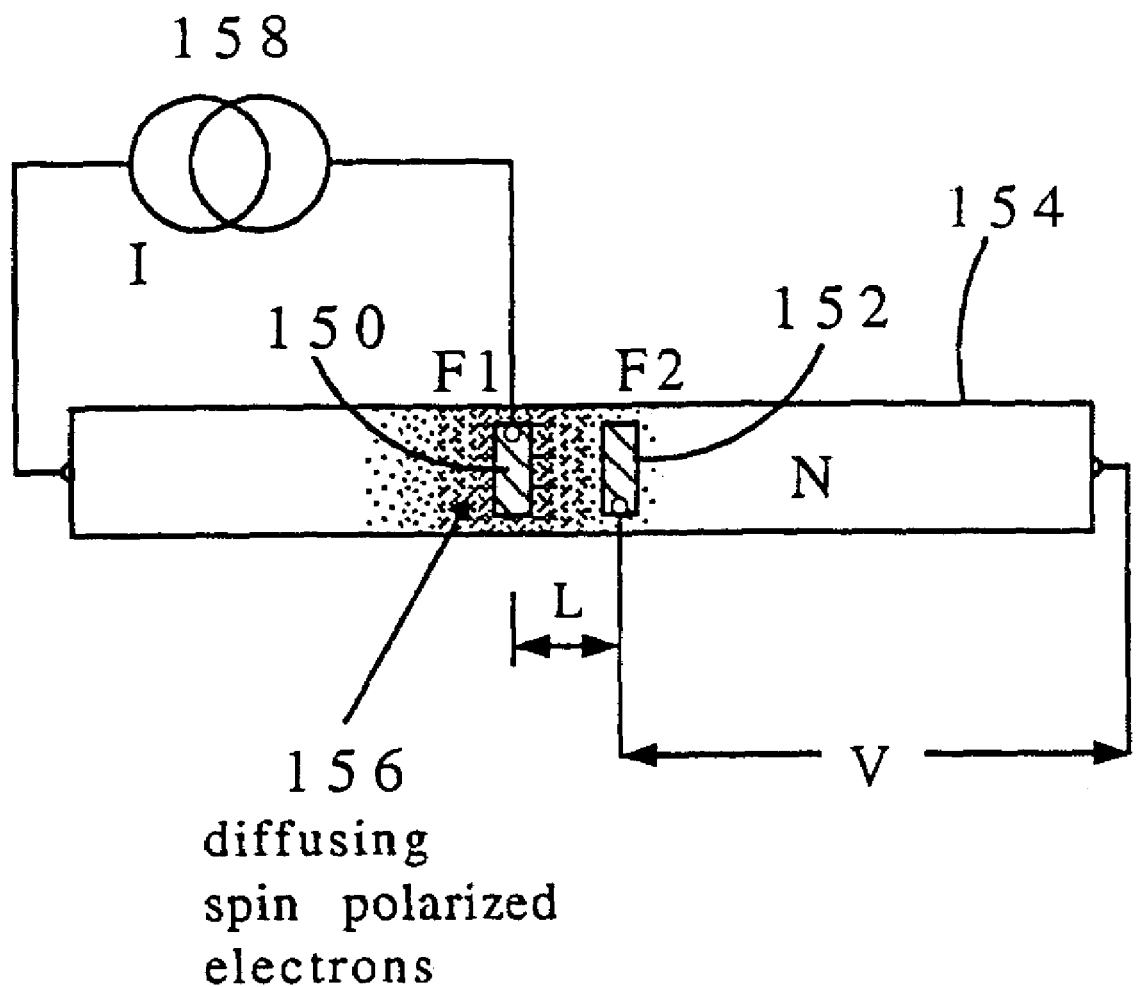
FIG. 1 is a schematic top view of a prior art "spin injection" all metal transistor that makes use of a spin polarized electron current.
Figure 2:
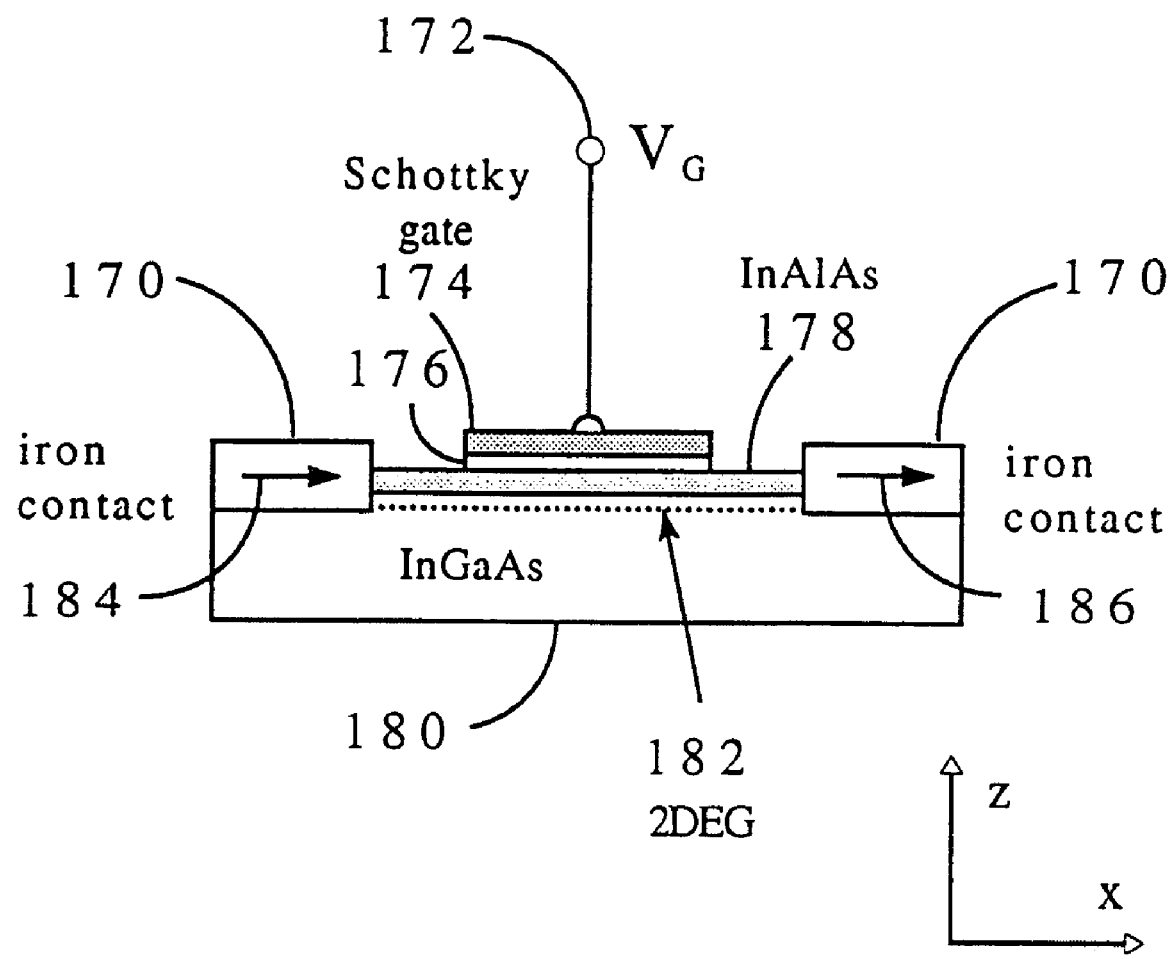
FIG. 2 is a schematic cross-sectional view of a prior art FET current modulator using ferromagnetic films
Figure 3:
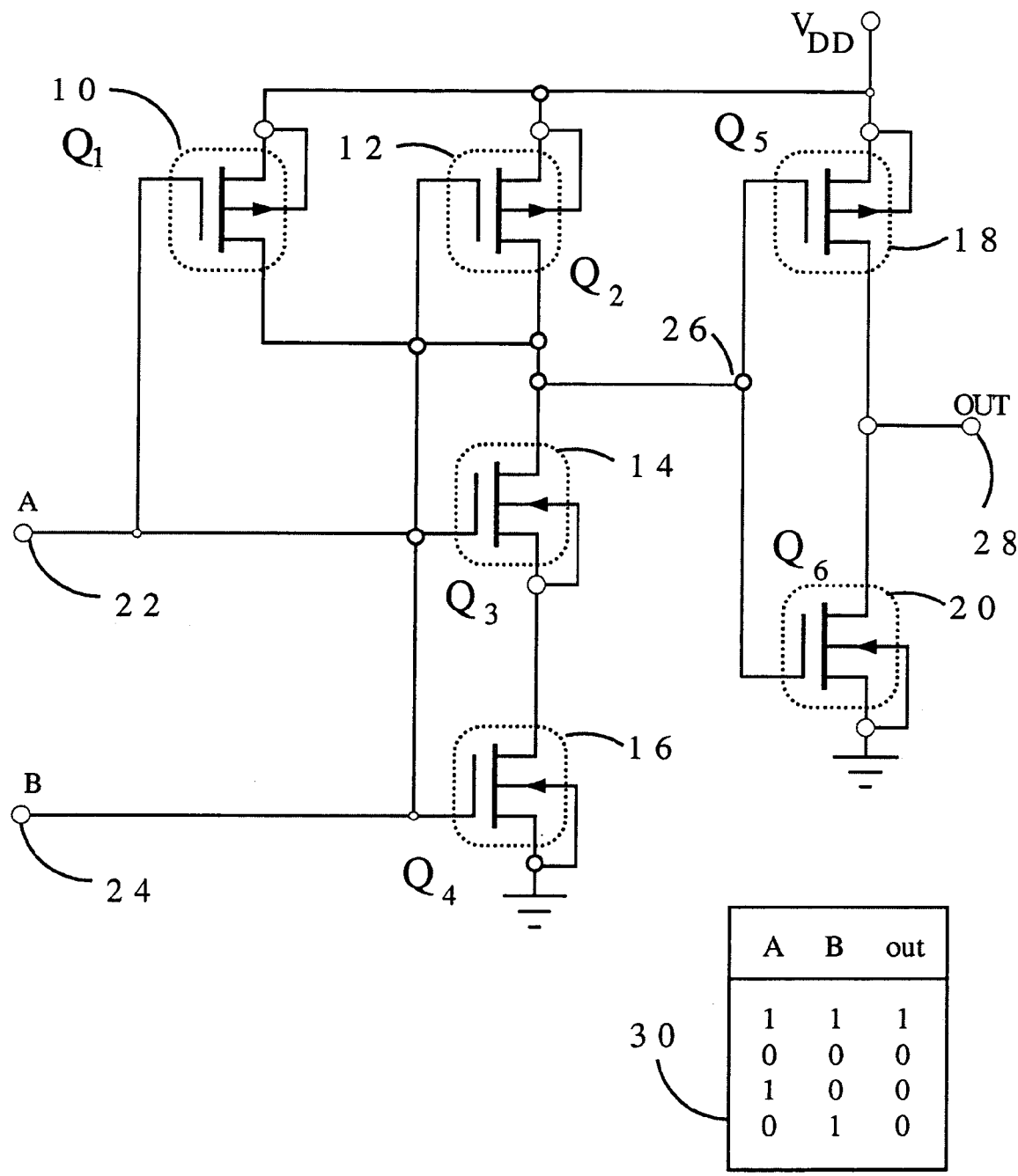
FIG. 3 is a schematic representation of a logical AND gate cell comprised of conventional semiconductor field effect transistors (FETs), and an accompanying truth table.
Figure 4:
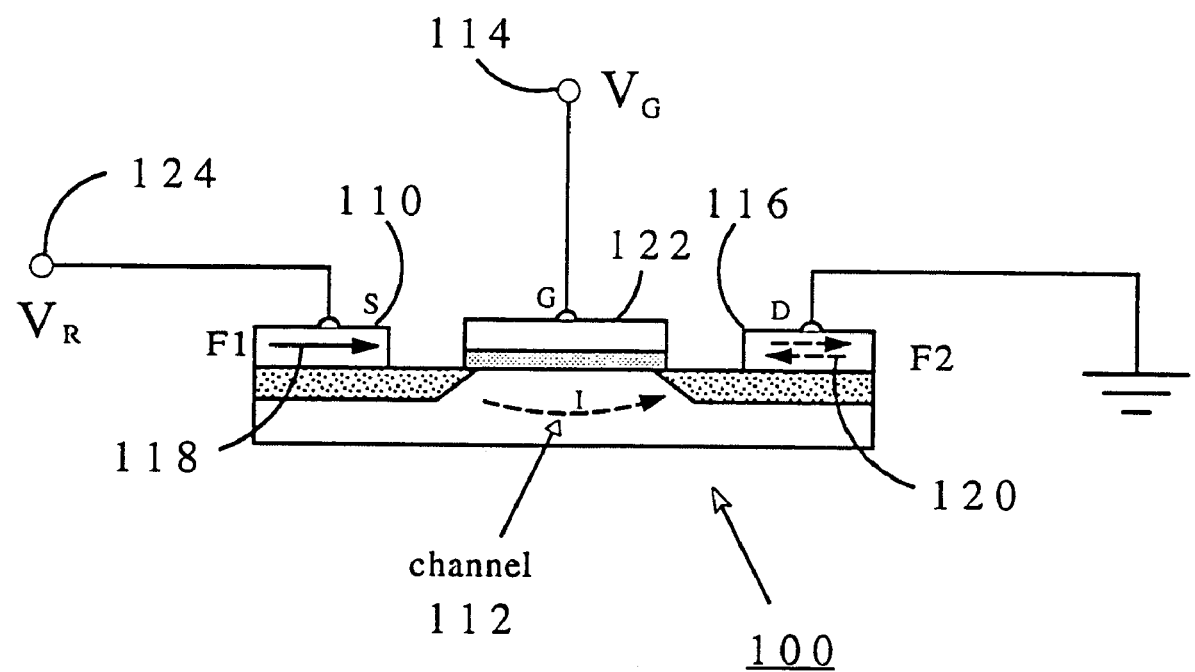
FIG. 4 is a schematic cross-sectional view of a spin injected FET constructed in accordance with the teachings of the present invention.

A preferred embodiment of the invention is illustrated in FIG. 4. A spin injected FET 100 can be created from applying spin injection techniques to a high mobility semiconductor system (refer to FIG. 4). A ferromagnetic film F1 110 at the source S provides spin polarized carriers to a high mobility channel 112, the conductance of which is determined by a gate voltage, $V_G$ 114. A ferromagnetic film F2 116 at the drain D presents a spin sensitive impedance to current flow, so that the device conductance is high when the magnetizations $\hat{M}_s$ and $\hat{M}_d$ of source and drain are aligned parallel and low when $\hat{M}_s$ and $\hat{M}_d$ are antiparallel. If the magnetization 118 of one of the films, e.g. F1, is set in the "up" orientation [left to right in FIG. 4, i.e., in a direction substantially perpendicular to the axis of channel 112], then the resistance of the device has two distinct states determined by the magnetization orientation 120 of F2: "up"

(pointing to the right, equivalently LOW or "0") or "down" (pointing to the left, equivalently HIGH or "1") corresponds to LOW or HIGH channel resistance from source to drain (or vice versa). Thus, FET 100 can be used as a non-volatile memory element. Moreover, it will be apparent to skilled artisans that through use of selected materials, the magnetization orientation 120 in general can be set to any one of n distinct states, thus permitting a logical data item having n possible unique values to be stored in the memory element.

A logical data value (such as a binary bit value corresponding to a 0 or 1) can be written by using the magnetic fields from current pulses in overlaid write lines (illustrated in more detail in FIG. 7A), to orient $\hat{M}_d$ either up or down. The stored information is nonvolatile, and is isolated from the array because the conductance of the channel also has two states: approximately zero conductance (infinite impedance) in the "off" state when no gate voltage is applied (e.g. for an enhancement mode FET), and high conductance in the "on" state when a suitable voltage is applied to the gate.

The stored bit is read by sending a read voltage pulse 114 to gate 122, addressing the element by raising the conductance of the channel and setting the FET to the "on" state, biasing source 190 with a read voltage $V_R$ 124, and then sensing the source-drain conductance, discriminating between two values that differ because of the spin-dependent conductance (resistance) of the drain.

Figure 5:
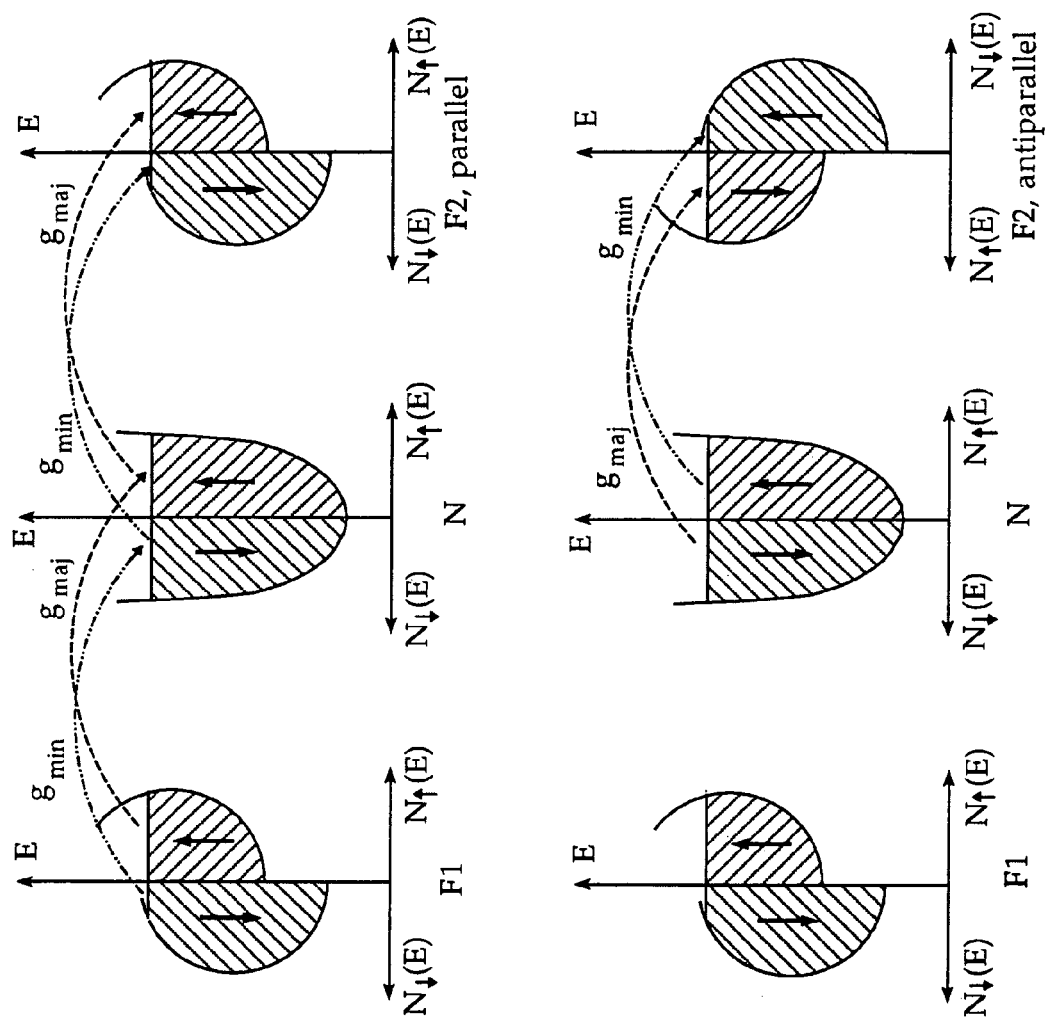
FIG. 5 includes a number of density of state diagrams to describe charge and spin transport in the limit where two ferromagnetic electrodes are separated by a length L that is of the same order as an electron mean free path 1, and where spin accumulation ~M is negligible.

The variable (2 state) resistance of the FET can therefore be used to indicate the presence of a logical "1" or "0" data bit stored as the state of the FET. The variable resistance of the FET can be explained and modeled by the following analysis: If ferromagnetic films F1 118 and F2 120 are spaced (edge to edge) within a distance L of the order of a few electron mean free paths l, L~l, and if spin accumulation effects are weak (~M is small), then the current transport in the geometry of FIG. 4 is described by the density of state diagrams of FIG. 5. Typical values l are the order of 0.1 micron, and the preferred value of L is the order of 1 micron. For the case of negligible spin accumulation, the difference of resistance for the cases where $\hat{M}_1$ and $\hat{M}_2$ are parallel, $R_{par}$, and where $\hat{M}_1$ and $\hat{M}_2$ are antiparallel, $R_{anti}$, relative to the total resistance between F1 and F2, $R_{ave}$, is equal to:

$$R_{anti} - R_{par} = (2\eta^2 * R_{av})/(2-\eta^2)$$

where $\eta$ is the polarization efficiency of F1 and F2. This result also assumes that L is smaller than a spin-flip mean free path $\Lambda = v_F * T1$, where $v_F$ is the Fermi velocity and T1 is the mean time that an electron remains polarized within the channel.

For the case that N is the conducting channel of an FET or a 2 dimensional electron gas (2DEG), the results expressed above describe a channel resistance whose value depends on the relative orientation of the magnetizations of the ferromagnetic films, and this variable resistance is useful for implementing a spin injected FET as a memory cell or logic gate.

Figure 6A:
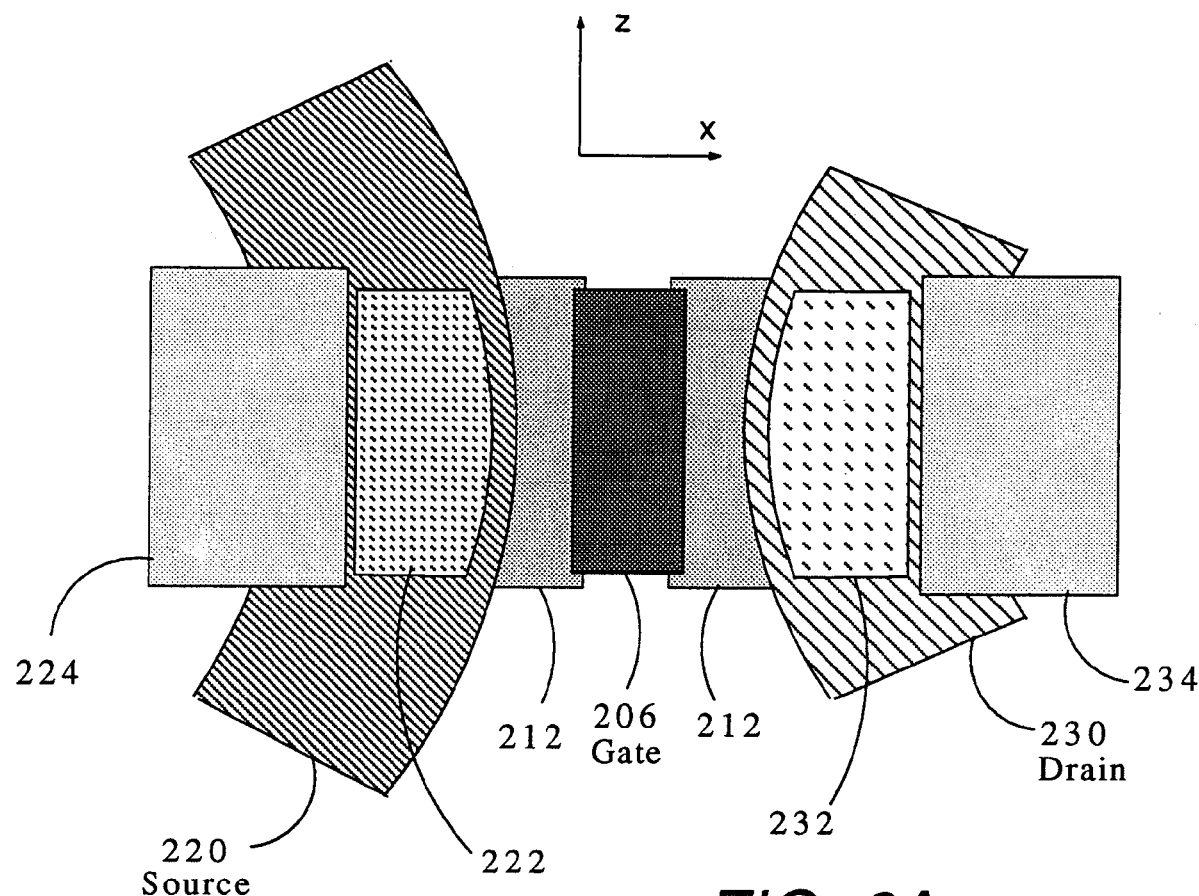
FIG. 6A is a top view of a typical physical implementation of the spin injected FET illustrated in FIG. 4.
Figure 6B:
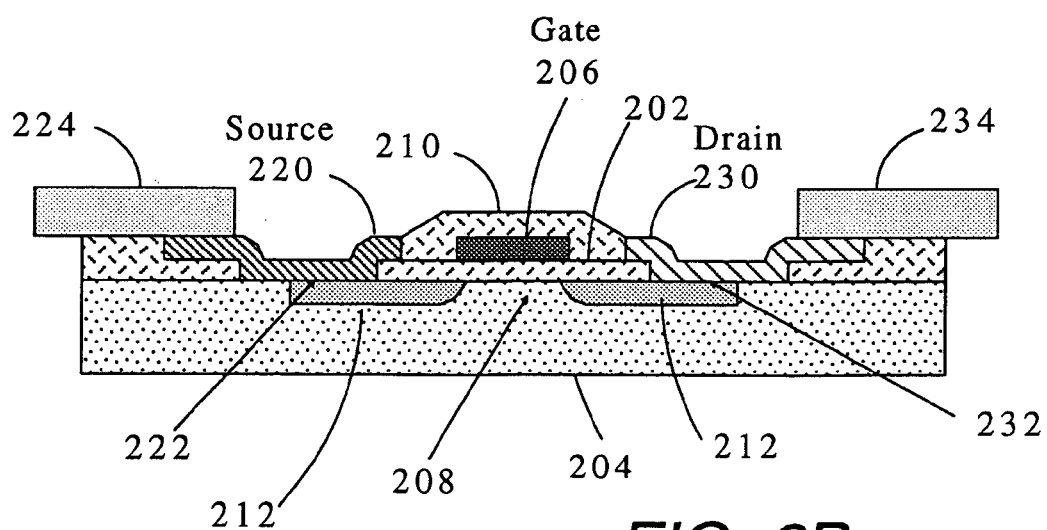
FIG. 6B is a further cross-sectional view of the spin injected FET illustrated in FIG. 4.

A more detailed look at the structure of a preferred embodiment of a spin injected FET, where spin injection is incorporated into an enhancement mode FET, is depicted in a top view in FIG. 6A and in a cross-sectional view in FIG. 6B. Two regions of high conductance material 212 having an approximate thickness of 100 nm are incorporated into the surface of a p-type silicon substrate 204. The high conductance material can be a highly n-doped region of the Si, a metallic or polysilicon layer, an epitaxial layer of high mobility semiconducting material [such as InAs], a metallic layer diffused into a doped region of the substrate, or any other material with similar electrical properties. One function of the high conductance layer 212 is to diminish (or eliminate) the Schottky barrier that typically exists at the interface between a (ferromagnetic) metal and a semiconductor, and thereby improve the ohmic contact between the source 220 (or drain 230) and conducting channel 208. By improving the Ohmic contact, spin transmission between source 220 (or drain 230) and channel 208 are enhanced (i.e. a the value of $\eta$ is increased). Another function of the high conductance layer 212 is to shorten the length $L_c$ of the channel 208. Thus, the source 220 and drain 230 may be separated, edge to edge, by 1 micron, and the high conductance layer may extend 0.2 micron from the edge of the source 220 and drain 230 so that the length of the channel is reduced to $L_c$=0.6 micron. Finally, it will be understood to those skilled in the art that the high conductance layer 212 is most effective in silicon based devices. There are alternative materials systems, such as Indium Arsenide-Indium Antiminide heterostructures, where ohmic contact between the ferromagnetic source 220 (or drain 230) and channel (208) is intrinsically good and no highly conducting layer is required. Even in silicon based devices, the highly conducting layer is not theoretically necessary, but it is likely that its presence enhances device performance by an important measure. In other words, it is likely that a Schottky barrier randomizes the spin orientation of the polarized current so effectively that the resulting polarization values are so small as to make the device impractical.

An insulating layer 202 (silicon dioxide, polyimide, etc.), 40 nm thick coats a portion of a p-type silicon substrate 204, overlapping a portion of the conductive material 212. A thin film of highly conducting material 206 (metal or polysilicon) approximately 0.7 microns wide is fabricated over the insulator to a thickness of 60 nm and can operate as a gate: in this embodiment, a positive voltage applied to the gate draws charge carriers to the surface of the substrate and increases the conductivity of a channel 208 near the insulator-substrate interface, beneath the gate, allowing current flow between the two high conductance regions 212 when a bias voltage is applied between source 220 and drain 230. Those skilled in the art will appreciate that this is essentially the same gating operation as that typically used in an enhancement mode FET, where the high conductance regions are doped, n-type silicon. Moreover, while the preferred embodiment is shown to be an enhancement mode FET, it will be apparent to those skilled in the art that the present invention can be used with any general FET geometry, including those having lightly doped source/drains, vertical topologies, etc.

A second insulating layer 210, deposited to a thickness of approximately 50 nm covers the gate to isolate it during subsequent processing steps. A thin ferromagnetic film 220 [e.g. of permalloy, cobalt, iron a Heusler alloy or $Fe_{0.5}Co_{0.5}$] which is 60 nm thick (film 220 may be coated by a 10 nm thick layer of nonmagnetic metal, such as Ti or Au, in order to prevent oxidation) is deposited on one side of the gate making ohmic contact with highly conductive layer 212 in the region of a via hole 222. This film 220 can be considered as a ferromagnetic "source" of the spin injected FET. A metallic strip 224 (or similar conductor) approximately 100 nm thick overlaps the ferromagnetic film 220 and is also connected to a read or bias line. As described above, ferromagnetic source 220 is chosen [by choice of material, exchange bias, or induced magnetic anisotropy] to have a relatively large coercivity $H_{c,1}$ with an easy magnetization axis parallel to $\hat{z}$. During device operation, the magnetization is set initially in the up orientation [or, alternatively, down] along $+\hat{z}$, and the magnetization in source 220 typically remains in that orientation during all device operations. The shape of source 220 in FIG. 6A is chosen to be a crescent so that fringe fields from magnetic poles at the ends of the film are kept far from the gate region. Those skilled in the art will appreciate that other geometries that minimize stray fields in the region of the gate work equally well.

A second thin ferromagnetic film 230 [of permalloy, cobalt, $Fe_{0.5}Co_{0.5}$, etc.] is deposited to a thickness of 70 nm on the other side of the gate making ohmic contact with the highly conductive medium in the region of a via hole 232. This film 230 can be considered as a ferromagnetic "drain" of the spin injected FET. A metallic strip 234 (similar in composition and thickness to strip 224) overlaps the ferromagnetic film 230 and is also connected to a bit line. Ferromagnetic drain 230 is chosen [by choice of material or induced magnetic anisotropy] to have a small coercivity, $H_{c,2} < H_{c,1}$, with a relatively easy axis parallel to $\hat{z}$.

Figure 7A:
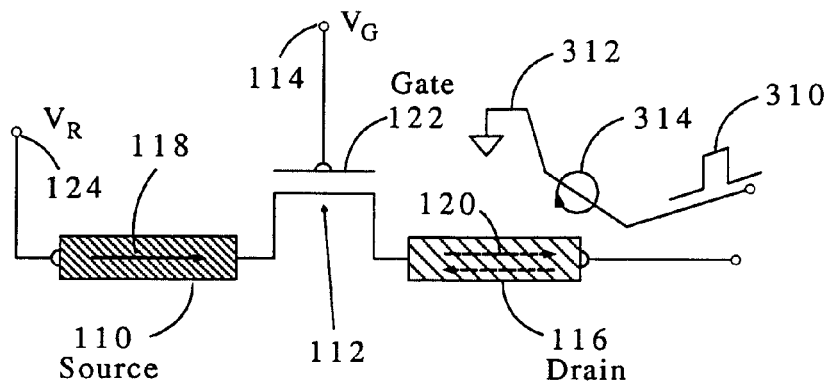
FIG. 7A is a schematic cross-sectional view of a further embodiment of the present invention including a spin injected FET which operates as a memory cell, and an inductively coupled write line used for writing a logical data value to this cell.

During device operation, the orientation of the magnetization of the drain can be set by an overlaid set of write lines, depicted schematically in FIG. 7A. In a write procedure, sending a write current pulse 310 of positive [negative] polarity and magnitude 2 mA down write line 312 (located approximately 50 nm away from drain 116) generates a magnetic field 314 at the drain 116 and orients (sets) the magnetization state 120 of the drain to be up (or down), parallel (or anti-parallel) relative to the orientation 118 of the source 110. While the write line is described as a "line" it will be understood by persons skilled in the art that any number of well-known structures capable of carrying sufficient current (including for example a conductive film, or an interconnect line) to generate the field H will be suitable in the present invention. Moreover, while not essential to the description of the present invention, additional details concerning the operation of read/write lines in connection with ferromagnetic layers can be found in the aforementioned pending application Ser. Nos. 08/425884 and 08/493815.

Under these conditions therefore, the spin injected FET has two settable and stable states, determined by whether magnetization orientation 118 of drain 116 is up or down (parallel or anti-parallel relative to the magnetization orientation 120 of source 110), which states can correspond to a stored "bit" of data (i.e, 0 or 1). Moreover, when no voltage is applied to gate 122, channel 112 has a high electrical impedance [e.g. for an enhancement mode FET] and no spin polarized current can flow from source 110 to drain 116. The stored bit of information is thus nonvolatile, and is isolated from the memory array by the high resistance of channel 112.

As seen in FIG. 6A, in a preferred embodiment, ferromagnetic film 220 (source) and/or ferromagnetic film 230 (drain) are formed with an asymmetric shape. The shape of the ferromagnetic layers is symmetric about the x-axis, and asymmetric about the z-axis; the latter, as explained above, represents an easy axis of magnetization. The ferromagnetic elements may also include both a convex portion and a concave portion as represented by the right side and left side curved sections of such elements, as well as straight portions. The curved sections are preferably aligned along the asymmetric or easy axis. As further seen in FIG. 6A, the convex portion of ferromagnetic element 230 is preferably situated so as to be opposite the convex portion of ferromagnetic element. Again in preferred embodiments element 220 has a larger coercivity and is also physically larger than element 230 which in turn has a lower coercivity so that it can be changed in response to a write signal.

In a read process, a positive voltage $V_G$ 114 is applied to gate 122, channel 112 has a relatively high conductance and a bias voltage $V_R$ 124 causes current to flow from source 110 to drain 116. The electric current which flows is comprised of spin polarized electrons which enter the highly conductive material 212 (refer to FIG. 6B). Since the dimensions of the highly conducting material 212, extending about 0.2 micron past the edge of the source 220 and to a thickness of about 0.1 micron, are much smaller than the characteristic spin diffusion length $\delta_{s,1}$ (estimated to be about 1 micron) in the highly conductive material, the current that enters the channel 208 retains a large fraction of its initial spin polarization. Furthermore, the preferred orientation of the magnetization of the source is along $+\hat{z}$ (or $-\hat{z}$); the injected spins will be oriented along the $\hat{z}$ axis and will not precess under the influence of gate voltage $V_G$ (114 in FIG. 7A). The presence or lack of precession (more accurately, enhanced versus diminished precession) is an operational difference between the Datta/Das device and the present invention. As described above, the electronic source-drain conductance will have two different values for the two different states (0 or 1) of the device, with parallel or antiparallel magnetization orientation, so the quantity of spin polarized current which flows will be a function of this conductance. The readout operation is completed by sensing the source-drain conductance and discriminating between the two possible current values. It will be apparent to those skilled in the art that a ferromagnetic drain (or source) can be fabricated with n stable magnetization states, and the operation of the 2-state device described herein can be generalized to operation of an n-state device.

Figure 7B:
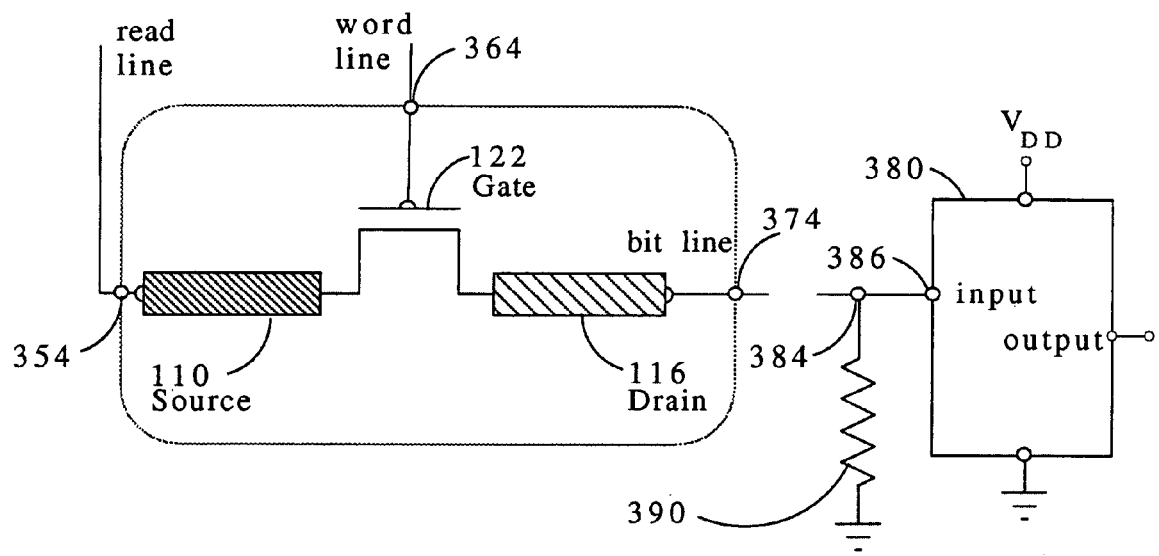
FIG. 7B is a schematic cross-sectional view of a further embodiment of the present invention including a memory array having spin injected FETs operating as single memory cells, and a sense circuit that is used for reading the logical data value stored in a single cell.

An example of sensing the logical data state of a spin injected FET used as a single element memory cell, is depicted in FIG. 7B. Source 110 is connected to a common read [or bias] line at a terminal 354, gate 122 to a common word line at a terminal 364, and drain 116 to a common bit line at a terminal 374. At the end of the bit line is a sense circuit 380 which compares the readout of the cell with a reference voltage [internally or externally supplied]. A word line voltage applied to gate terminal 364 selects the cell for reading. A read line voltage is simultaneously applied to source terminal 354. As suggested above the source-drain current has one of two values, determined by the two conductance values of the spin injected FET in series with resistance R 390 at the end of the bit line. These two current values in turn can develop two different voltage values at the top 384 of resistor 390 and at an input 386 of a sense amplifier 380. This voltage value is compared with a reference voltage thus the logical value stored in the cell is interpreted as a logical "1" or a "0."

Figure 7C:
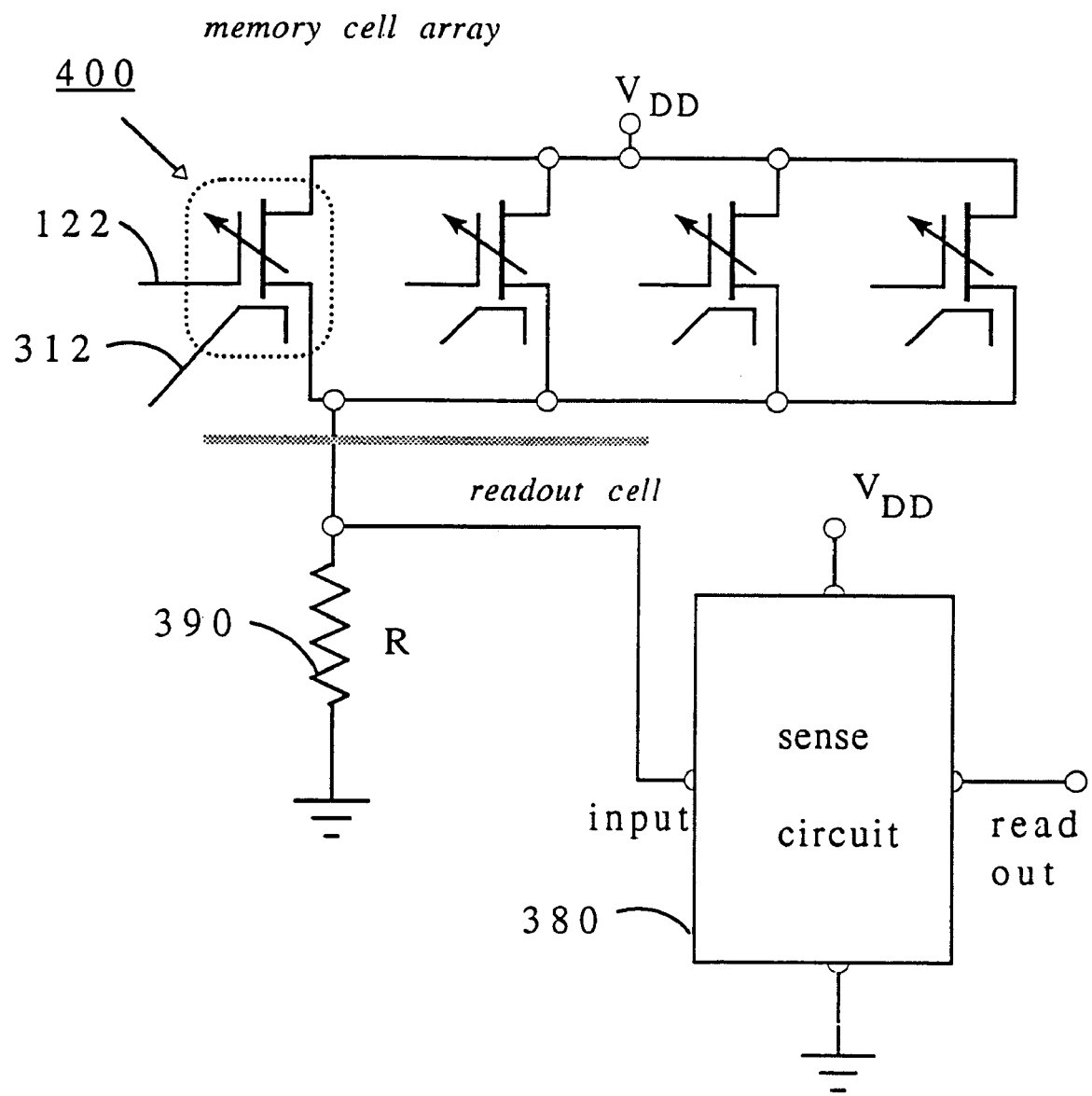
FIG. 7C is a schematic plan view of another embodiment of the present invention which includes an array of spin injected FET memory cells and a sense circuit that is common to a number of cells in the array.

To form a memory array, a number of spin injected FET memory cells can be configured as depicted in FIG. 7C. Here each spin injected FET is drawn with a symbol for a conventional semiconductor FET with an additional arrow representing a variable resistance value, referring to the two resistance values when the FET is in the "on" state. Write line 312 is included for each spin injected FET, in the symbol, to the side of the drain. A single sense circuit 380 is common for all the cells in the array. Each cell is isolated from the array, and its value is sensed only when addressed. For example, cell 400 is sensed only when addressed by a pulse applied to its gate 122. Finally, while not shown or discussed explicitly herein, it will be apparent to those skilled in the art that additional peripheral and support circuits commonly associated with semiconductor memory arrays (decoders, buffers, latches, equalization, precharge, etc) can be easily adapted for use with the present invention.

The spin injected FET is an improvement over DRAM because the memory cell has a single element so that packing densities can be greater. It also has superior signal to noise ratio, and the memory is nonvolatile so that the array draws substantially less power. The spin injected FET is an improvement over other nonvolatile technologies because the cell is simpler, packing densities are greater, signal to noise is superior, and isolation from the array is more efficient.

The device may also be used as a field sensor, e.g. in a recording head. Note that the readout voltage can be increased by varying parameters such as the type of ferromagnetic material and thickness. For example, different magnetic materials have different values of spin transport parameter $\eta$ and some materials with optimum values of $\eta$ can be found empirically, with candidate materials including ferromagnetic metals, semimetals, semiconductors and perovskites.

Spin Injected FET as Logic Gate

Boolean logic processes can also be performed using the present spin injected FET. For example, a logic input having two logical data values can be represented by two different current levels on a data wire. This logical input (having a particular current level corresponding to a "1" or "0") can be combined with a second logical input (also having a current level corresponding to either a "1" or "0"), and the combined sum of the current levels of these logical inputs then can be applied to a write line coupled magnetically to a ferromagnetic layer of the FET (source or drain). The sum of these logic inputs constitutes a write current pulse in the write line and a corresponding magnetic field acts inductively on the magnetization state $\hat{M}$ of the ferromagnetic layer. Depending on the state of the orientation $\hat{M}$ of the ferromagnetic layer, and the particular combination of inputs therefore, the magnetic field of the write current pulse may alter this orientation, thus "storing" the result of the logic operation in the form of a new magnetization orientation in the ferromagnetic layer. Again, while not essential to the description of the present invention, additional details concerning structures and circuits usable in connection with magnetic spin transistor boolean logic processing devices can be found in the aforementioned pending application Ser. No. 08/493,815.

Those skilled in the art will appreciate that this principle can be extended to create an N input logical AND gate or similar logic processor. For example, a logic processing device can be implemented wherein the magnetization state of the drain of the FET is set so that it can only altered when all N inputs are a "high" current level, thus generating a sufficiently high magnetic field to change the orientation of the FET ferromagnetic layer. Other configurations for adapting other boolean processes will be readily apparent to skilled artisans.

The result is automatically stored as a boolean function data value and can be read out at any later time. In this way the spin injected FET can function as a logic gate with memory capability. If the readout operation enables the result ("0" or "1", HIGH or LOW) to be transmitted to another gate for another operation, then gates can be linked together to perform combinational tasks of digital processing. An example of an appropriate readout technique is presented in FIG. 8. Readout circuit 410 amplifies an output to an appropriate CMOS level (HIGH or LOW) so that it can be integrated with CMOS (or, for an appropriate circuit, TTL) logic. Alternatively, the output can be sent to the write line of another spin injected FET gate.

Figure 8:
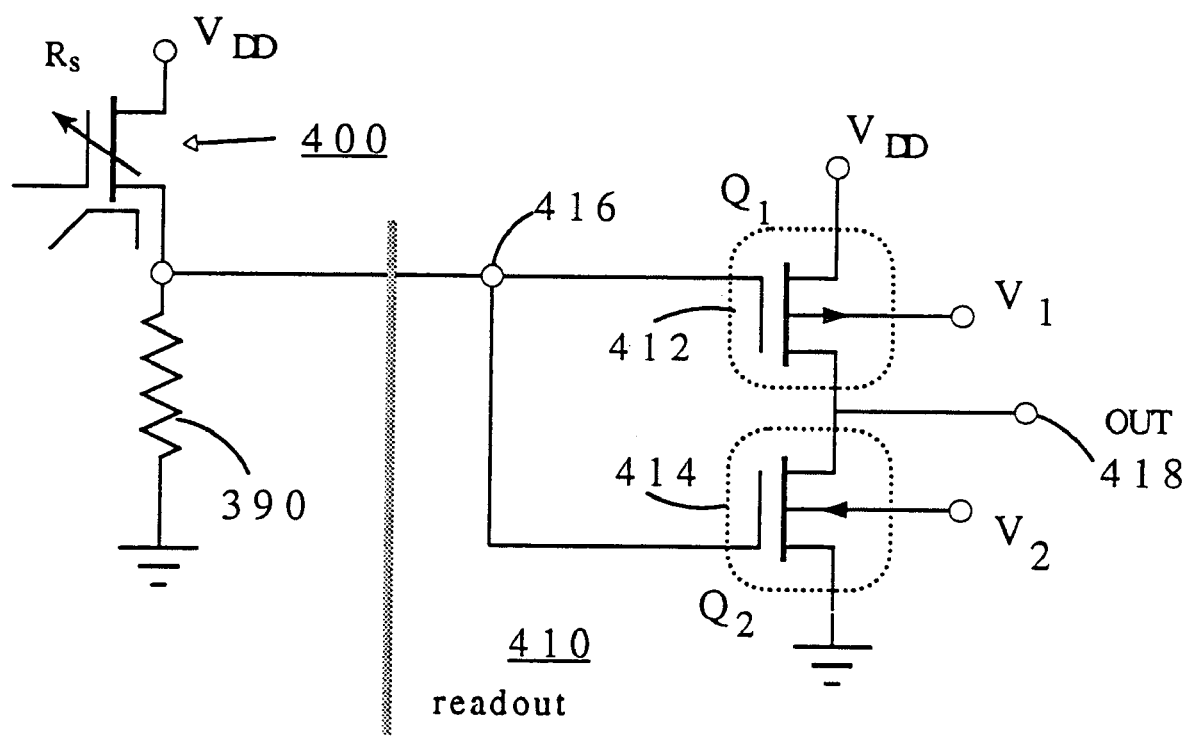
FIG. 8 is a schematic view of a further embodiment of the present invention which includes a spin injected FET used as a logic gate and a readout circuit that can be used therewith.

The example is presented for the case of an n-channel enhancement mode spin injected FET. Other devices (depletion mode, p-channel, etc.) can be fabricated incorporating ferromagnetic layers and constructed and operated in a similar way readily apparent to those skilled in the art. As seen in FIG. 8, a spin injected FET 400 has two resistive values in the "on" state, $R_s = R' +/- \Delta R$. In a real MOSFET device, R' may typically have a value R'=100 $\Omega$, and the spin dependent resistance may vary by 15% so that $R_s$=85, 115 $\Omega$ are the LOW and HIGH resistive values of the device. Typically readout resistor R 390 would be matched to the value R', and the bias voltage would have the value $V_{DD}$=15 Volts. In readout circuit 410, FET $Q_1$ 412 can be a p-channel enhancement mode FET whose body is biased to a relatively high value, $V_1$=8.1 Volts. FET $Q_2$ 414 is an n-channel enhancement mode FET whose body is biased to a relatively low value, $V_2$=7.0 Volts. The bias can be provided by an external voltage source, appropriate doping or other methods known in the art.

When $R_s$ is LOW (85 $\Omega$), the voltage at input node 416 to readout circuit 410 is relatively HIGH (8.1 V). In this situation, $Q_1$ 412 is "off", $Q_2$ 414 is "on" and output 418 is clamped LOW (ground). When $R_s$ is HIGH (115 $\Omega$), the voltage at input 416 to readout circuit 410 is relatively LOW (7.0 V). In this case, $Q_1$ 412 is "on", $Q_2$ 414 is "off" and output 418 is clamped HIGH ($V_{DD}$). Readout circuit 410 thus functions to convert the input levels to conventional CMOS output values (GND and $V_{DD}$).

When the elements of FIG. 8 are considered as a single logic function (AND) gate, the number of constituent elements is three, only half the size of the typical CMOS gate, and therefore packing densities of logic gates can be increased. The result of the logic operation is automatically stored as a nonvolatile state. Since no additional memory cell is needed to store the result, further increases of density (and operating speed) are achieved. Furthermore, it is possible to associate a single readout driver circuit with several spin injected FETs. Each of the latter can perform a simple programmed Boolean operation and store the result in a non-volatile manner. At any desired time, the results of these operations can be called in any sequence. Thus, the spin injected FET can function as a general purpose element of a programmable logic array, or gate array. Again, typical support circuits known in the art and associated with such programmable logic arrays can be used to augment and enhance the performance of circuits embodying the present invention.

Although the present invention has been described in terms of a preferred embodiment, it will be apparent to those skilled in the art that many alterations and modifications may be made to such embodiments without departing from the teachings of the present invention. For example, while not shown or discussed explicitly herein, it will be apparent to those skilled in the art that additional peripheral and support circuits commonly associated with semiconductor memory arrays (decoders, buffers, latches, equalization, precharge, etc) can be easily adapted for use with the present invention. Moreover, while the preferred embodiment is shown to be an enhancement mode FET, other active devices (depletion mode, p-channel, etc.) can be fabricated using well known techniques to include the teachings of the present invention.

Furthermore, other suitable FET orientations and geometries, including those having lightly doped source/drains, vertical topologies, etc. can be used with the present invention.

In addition, it will be apparent to those skilled in the art that a device can be constructed in a stacked fashion, i.e., having multiple levels of the memory cells or logic gates of the present invention. This can be accomplished merely by adding a passivating layer or similar insulating layer between such levels, along with appropriate conventional interconnect and peripheral support circuits. Thus, a device constructed in this manner can have even greater integration advantages over prior art.

Accordingly, it is intended that the all such alterations and modifications be included within the scope and spirit of the invention as defined by the appended claims.

What is claimed is:

1. A magnetic field sensor device comprising:
   a first ferromagnetic region having a first fixed magnetization state and characterized by a first coercivity;
   a first enhancement region coupled to said first ferromagnetic region, which enhancement region is adapted to increase a polarization efficiency for a spin polarized current;
   a second ferromagnetic region characterized by a second coercivity smaller than said first coercivity, and which second ferromagnetic region has a second magnetization state which is configured to respond to a magnetic field generated by magnetic data;
   a second enhancement region coupled to said second ferromagnetic region, which second enhancement region is also adapted to increase a polarization efficiency for a spin polarized current;
   wherein the sensor device has a variable magnetic resistance based on a relationship between said first magnetization state of said first ferromagnetic region and said second magnetization state of said second ferromagnetic region such that a value of a spin polarized current conducted in the sensor device varies in accordance with said magnetic data.

2. The magnetic field sensor device of claim 1, further including a high electrical impedance region situated between said first ferromagnetic region and said second ferromagnetic region.

3. The magnetic field sensor device of claim 1 further including an antioxidation layer covering at least a portion of said second ferromagnetic region.

4. The magnetic field sensor device of claim 1 wherein a spin polarized current is injected with a spin that is related to a magnetization orientation of said first ferromagnetic region.

5. The magnetic field sensor device of claim 1 wherein said enhancement regions are made of at least one of a doped region of silicon, a metallic layer, a polysilicon layer, an epitaxial layer of high mobility semiconducting material, and/or a metallic layer diffused into a substrate.

6. The magnetic field sensor device of claim 1 wherein a distance between said enhancement regions is less than 0.6 microns.

7. The magnetic field sensor device of claim 1 wherein a distance between said ferromagnetic regions is less than 1 micron.

8. The magnetic field sensor device of claim 1 wherein said enhancement regions are substantially thinner than a characteristic spin diffusion length.

9. The magnetic field sensor device of claim 1 wherein said enhancement regions are about 0.1 microns in thickness.

10. The magnetic field sensor of claim 1, wherein both said first ferromagnetic region and said second ferromagnetic region overly a silicon substrate.

11. The magnetic field sensor of claim 1, wherein said second ferromagnetic region includes a layer of at least one of a ferromagnetic metal, a semimetal, a semiconductor, and/or a perovskite.

12. The magnetic field sensor of claim 1, wherein said first ferromagnetic region is larger in size for the magnetic field sensor than said second ferromagnetic region.

13. The magnetic field sensor of claim 1, wherein said first ferromagnetic region operates as a spin current injector and said second ferromagnetic region operates as a spin current detector.

14. The magnetic field sensor of claim 1, wherein said first ferromagnetic region includes a Heusler alloy.

15. The magnetic field sensor of claim 1, wherein said first ferromagnetic region includes at least one of permalloy, cobalt, iron and/or FeCo.

16. The magnetic field sensor of claim 1, wherein said second ferromagnetic region includes a Heusler alloy.

17. The magnetic field sensor of claim 1, wherein said second ferromagnetic region includes at least one of permalloy, cobalt, iron and/or FeCo.

18. The read head of claim 1, wherein said second ferromagnetic region has n separate stable states, where n>2.

19. A read head for use with magnetic recording media comprising:
    a first ferromagnetic layer having a first fixed magnetization state;
    a second ferromagnetic layer having a second magnetization state which is variable and configured to respond to a magnetic field generated by magnetic data;
    at least a first enhancement layer and a second enhancement layer situated between said first ferromagnetic layer and said second ferromagnetic layer, which enhancement layers are adapted to reduce spin orientation randomization for a polarized current;
    wherein said magnetic data can be determined by reading a value of said spin polarized current which varies in accordance with a relationship between said first magnetization state of said first ferromagnetic layer and said second magnetization state of said second ferromagnetic region.

20. The magnetic field sensor device of claim 19, further including a high electrical impedance layer situated between said first ferromagnetic layer and said second ferromagnetic layer.

21. The read head of claim 20, wherein said high electrical impedance region can be controlled by a bias signal to have a high impedance or a low impedance to said spin polarized current.

22. The read head of claim 19 further including an antioxidation layer covering at least a portion of said second ferromagnetic layer.

23. The read head of claim 19 wherein a spin polarized current is injected with a spin that is related to a magnetization orientation of said first ferromagnetic layer.

24. The read head of claim 19 wherein said enhancement layer are made of at least one of a doped region of silicon, a metallic layer, a polysilicon layer, an epitaxial layer of high mobility semiconducting material, and/or a metallic layer diffused into a substrate.

25. The read head of claim 19 wherein a distance between said enhancement layer is less than 0.6 microns.

26. The read head of claim 19 wherein a distance between said ferromagnetic layer is less than 1 micron.

27. The read head of claim 19 wherein said enhancement layer are substantially thinner than a characteristic spin diffusion length.

28. The read head of claim 19 wherein said enhancement layer are about 0.1 microns in thickness.

29. The read head of claim 19, wherein both said first ferromagnetic layer and said second ferromagnetic layer overly a silicon substrate.

30. The read head of claim 19, wherein said second ferromagnetic layer includes a layer of at least one of a ferromagnetic metal, a semimetal, a semiconductor, and/or a perovskite.

31. The read head of claim 19, wherein said first ferromagnetic layer is larger in size for the magnetic field sensor than said second ferromagnetic layer.

32. The read head of claim 19, wherein said first ferromagnetic layer operates as a spin current injector and said second ferromagnetic layer operates as a spin current detector.

33. The read head of claim 19, wherein said first ferromagnetic layer includes a Heusler alloy.

34. The read head of claim 19, wherein said first ferromagnetic layer includes at least one of permalloy, cobalt, iron and/or FeCo.

35. The read head of claim 19, wherein said second ferromagnetic layer includes a Heusler alloy.

36. The read head of claim 19, wherein said second ferromagnetic layer includes at least one of permalloy, cobalt, iron and/or FeCo.

37. The read head of claim 19, wherein said second ferromagnetic layer has n separate stable states, where n>2.

38. A spin polarized electron current magnetic field sensing device comprising:
   a first ferromagnetic layer having a first magnetization characterized by a first coercivity and which responds to a magnetic field from magnetically recorded data;
   a first enhancement layer coupled to said first ferromagnetic layer, which enhancement layer is adapted to increase a polarization efficiency for a spin polarized current;
   a second ferromagnetic layer having a second magnetization characterized by a second coercivity larger than said first coercivity;
   an anti-oxidation layer covering at least part of said first second ferromagnetic layer;
   a second enhancement layer coupled to said second ferromagnetic layer, which enhancement layer is also adapted to increase a polarization efficiency for a spin polarized current;
   a high electrical impedance region situated between said first ferromagnetic layer and said second ferromagnetic layer, which high electrical impedance region can conduct a spin polarized current in response to a bias signal;
   wherein said magnetically recorded data can be determined by reading a value of said spin polarized current which varies in accordance with a relationship between said first magnetization state of said first ferromagnetic layer and said second magnetization state of said second ferromagnetic region.

39. The spin polarized electron current magnetic field sensing device of claim 38, wherein said enhancement layer reduces an ohmic contact resistance between said first ferromagnetic region and said high impedance region.

40. The spin polarized electron current magnetic field sensing device of claim 38, wherein said enhancement layer includes metal, and increases a polarization efficiency of a current injector used to generate polarized current with a predefined spin.

* * * * *